(12) United States Patent
Tsai et al.

(10) Patent No.: US 8,987,058 B2
(45) Date of Patent: Mar. 24, 2015

(54) METHOD FOR WAFER SEPARATION

(71) Applicant: Taiwan Semiconductor Manufacturing Company, Ltd., Hsin-Chu (TW)

(72) Inventors: Yu-Peng Tsai, Taipei (TW);
Wen-Hsiung Lu, Jhonghe (TW);
Cheng-Ting Chen, Taichung (TW);
Hsien-Wei Chen, Hsin-Chu (TW);
Ming-Da Cheng, Jhubei (TW);
Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/868,554

(22) Filed: Apr. 23, 2013

(65) Prior Publication Data

US 2014/0264885 A1    Sep. 18, 2014

Related U.S. Application Data

(60) Provisional application No. 61/778,341, filed on Mar. 12, 2013.

(51) Int. Cl.
*H01L 21/00* (2006.01)
*H01L 23/544* (2006.01)
*H01L 21/78* (2006.01)
*H01L 23/28* (2006.01)

(52) U.S. Cl.
CPC .............. *H01L 23/544* (2013.01); *H01L 21/78* (2013.01); *H01L 23/28* (2013.01)
USPC .......................................... 438/114; 438/113

(58) Field of Classification Search
CPC ........ H01L 21/78; H01L 21/68; H01L 21/304; H01L 23/544; H01L 23/28
USPC .......................................... 438/113, 114, 462
See application file for complete search history.

(56) References Cited

U.S. PATENT DOCUMENTS

| | | | |
|---|---|---|---|
| 6,369,451 B2 | 4/2002 | Lin | |
| 7,081,374 B2 * | 7/2006 | Yamaguchi | ................... 438/113 |
| 7,187,068 B2 | 3/2007 | Suh et al. | |
| 7,371,613 B2 * | 5/2008 | Shimanuki | .................... 438/113 |

(Continued)

FOREIGN PATENT DOCUMENTS

| | | |
|---|---|---|
| DE | 102005040213 A1 | 3/2006 |
| DE | 112005001949 T5 | 5/2007 |

(Continued)

*Primary Examiner* — Nikolay Yushin
(74) *Attorney, Agent, or Firm* — Slater & Matsil, L.L.P.

(57) ABSTRACT

A plurality of macro and micro alignment marks may be formed on a wafer. The macro alignment marks may be formed in pairs at opposite edges of the wafer. The micro alignment marks may be formed to align to streets on the wafer along a first and second direction. A molding compound may be formed on the wafer. The macro alignment marks may be exposed from the molding compound. A pair of the micro alignment marks may be exposed from the molding compound at opposite ends of the streets along the first and the second direction. The wafer may be aligned to a dicing tool using pairs of the macro alignment marks. The dicing tool may be aligned to the streets using pairs of the micro alignment marks. The wafer may be diced using successive pairs of micro alignment marks along the first and second direction.

22 Claims, 9 Drawing Sheets

(56) References Cited

U.S. PATENT DOCUMENTS

| | | |
|---|---|---|
| 2004/0012930 A1 | 1/2004 | Grigg |
| 2005/0080956 A1 | 4/2005 | Zaudtke et al. |
| 2009/0045513 A1 | 2/2009 | Kim et al. |
| 2009/0140442 A1 | 6/2009 | Lin |
| 2010/0013064 A1* | 1/2010 | Hsu ............................. 257/660 |
| 2010/0096754 A1 | 4/2010 | Lee et al. |
| 2010/0140760 A1 | 6/2010 | Tam et al. |
| 2013/0009307 A1 | 1/2013 | Lu et al. |
| 2013/0181338 A1 | 7/2013 | Lu et al. |
| 2014/0054764 A1 | 2/2014 | Lu et al. |
| 2014/0077361 A1 | 3/2014 | Lin et al. |
| 2014/0159223 A1 | 6/2014 | Chen et al. |

FOREIGN PATENT DOCUMENTS

| | | |
|---|---|---|
| KR | 20090018442 A | 2/2009 |
| KR | 20090120215 A | 11/2009 |
| KR | 20100131180 A | 12/2010 |

* cited by examiner

METHOD FOR WAFER SEPARATION

REFERENCE TO RELATED APPLICATIONS

This application relates to the following co-pending and commonly assigned patent application Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

CROSS REFERENCE TO RELATED APPLICATIONS

The present application claims priority to U.S. Provisional Application Ser. No. 61/778,341, filed on Mar. 12, 2013, entitled "Apparatus and Method for Wafer Separation," which application is hereby incorporated by reference herein.

BACKGROUND

In a semiconductor manufacturing process, integrated circuits (also referred to as "dies") are fabricated in a die area on a semiconductor wafer. The semiconductor wafer goes through many processing steps, which can include lithography, etching, doping, grinding, and/or depositing different materials onto the wafer. During manufacturing, the dies are separated from the wafer using dicing, cutting or singulation techniques such as saw-cutting or laser singulation. The separated dies can be further processed and/or stacked or bonded upon other dies to form three-dimensional integrated circuits ("3D ICs"), package on package ("PoP") structures or the like.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, the same reference numbers are used to designate the same or like elements.

In wafer manufacturing, a molding compound can be formed over an entirety of a wafer surface in order to protect devices, dies, electrical components, etc. that may be formed on the wafer. Although the molding compound provides a protective layer for the wafer and/or devices, dies, etc. that may be formed thereon, the molding compound can obscure scribe lines on the wafer. The scribe lines provide paths between the dies or components that are tracked by a dicing tool or saw to separate or singulate the wafer into individual dies or components. The molding compound formed over the entirety of the wafer's surface obscures these lines such that the dicing tool or saw is unable to effectively singulate the dies.

According to embodiments, molding compound may be formed over a wafer in a manner such that a portion or area of the wafer may be exposed or not covered by the molding compound. Macro alignment marks may be provided in the exposed area, which may provide for macro alignments of a dicing tool at edges of the wafer. Micro alignment marks may also be provided in the exposed area, which may provide for aligning the dicing tool to streets between dies or components of the wafer.

Figure 1A:
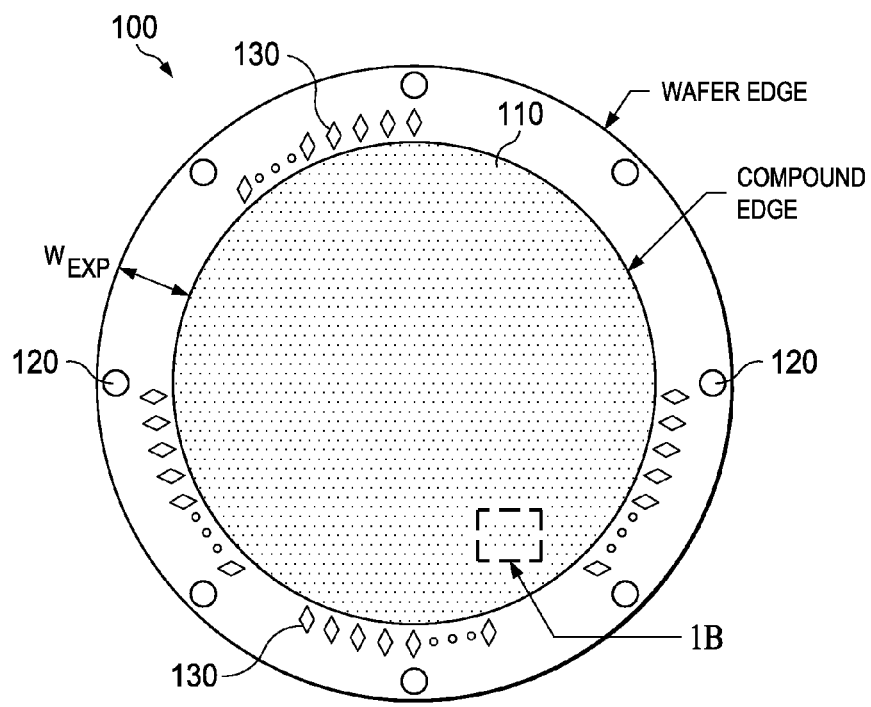
FIGS. 1A-1B illustrate a wafer having alignment marks according to an embodiment.

FIG. 1A illustrates a wafer 100 having alignment marks formed thereon according to an embodiment. As illustrated in FIG. 1A, a molding compound 110 may be formed over the wafer 100. The molding compound 110 may be formed in a manner such that an exposed wafer portion $W_{EXP}$ may exposed from the molding compound 110. The exposed wafer portion $W_{EXP}$ may have formed thereon one or more of macro alignment marks 120 and one or more micro alignment marks 130. In various embodiments, the exposed wafer portion $W_{EXP}$ may range from approximately 1.5 mm from the wafer edge to approximately 4 mm from the wafer edge.

Figure 1B:
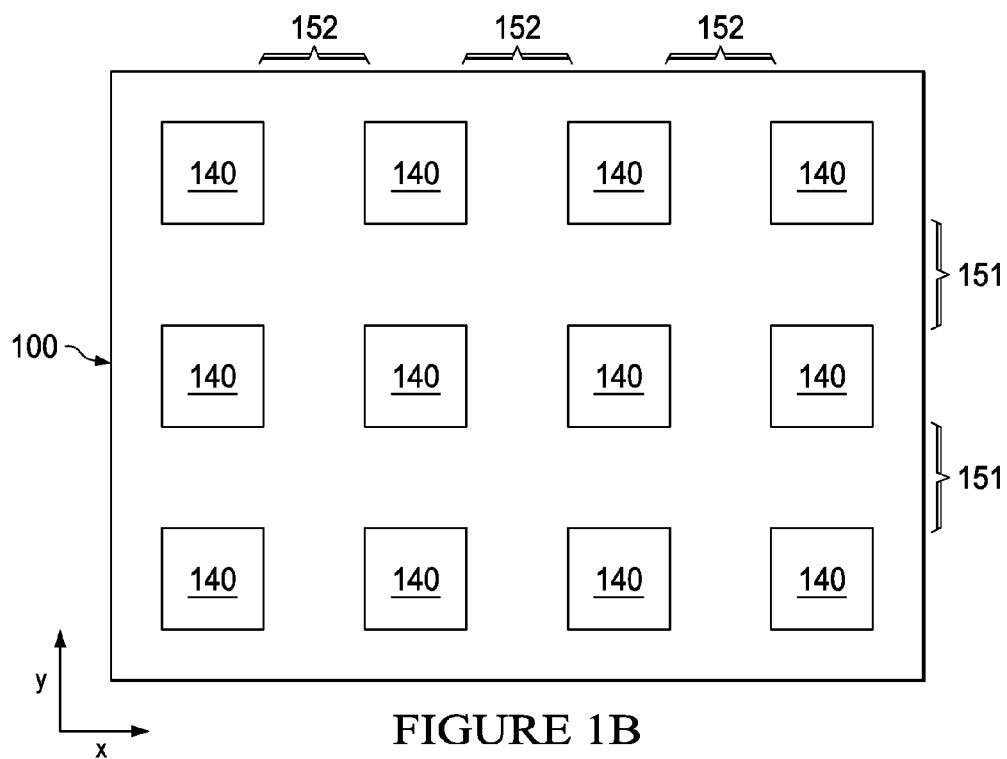

In various embodiments, the molding compound 110 may cover dies, electrical devices or circuits (not shown in FIG. 1A) on the wafer 100. For illustrative purposes, FIG. 1B provides a view of a plurality of dies 140 as may be formed on the wafer 100 beneath the molding compound 110. The area between the dies 140 (also referred to herein as "streets") may provide an area for cutting or dicing the wafer 100 to separate the dies 140 from the wafer 100. A first plurality of streets 151 may separate the dies 140 along a first direction of the wafer 100, for example, an X-axis direction, and a second plurality of streets 152 may separate the dies 140 along a second direction of the wafer 100, for example, a Y-axis direction.

Referring back to FIG. 1A, the macro alignment marks 120 may be formed in pairs near opposite edges of the wafer 100 along the first and/or second direction. The macro alignment marks 120 may have a first shape. The macro alignment marks 120 may be used in one or more first alignment processes to align a dicing machine or tool (not shown) to the wafer 100. The micro alignment marks 130 may be formed in pairs near the edges of the molding compound 110 along the first and second direction. The micro alignment marks 130 may have a second shape, which may be different from the first shape of the macro alignment marks 120. The micro alignment marks 130 may be used in one or more second alignment processes to align the dicing tool (not shown) to a corresponding street between arrays of dies (e.g., streets 151 and/or 152 between dies 140 of FIG. 1B) on the wafer 100.

As noted above, the shape of the macro alignment marks 120 may be different from the micro alignment marks 130. The macro alignment marks 120 are shown as circles and the micro alignment marks 130 are shown as diamonds in FIG. 1A. The shapes of the macro and micro alignment marks 120, 130 are provided for illustrative purposes only and are not meant to limit the scope of the embodiments discussed herein. Other shapes may be used for the macro and/or micro alignment marks 120, 130 and are described in further detail below.

Although not fully illustrated in FIG. 1A, the overall size of the macro and micro alignment marks 120, 130 may also be different from each other. In an embodiment, for example, the overall size of the macro alignment marks 120 may be larger than overall size of the micro alignment marks 130. Further, the micro alignment marks 130 may be sized to be smaller than a width of a street between the dies, for example, smaller than the width of the first and/or second streets 151, 152 between the dies 140 as shown in FIG. 1B. The overall size of the macro and/or micro alignment marks 120, 130 is discussed in further detail below.

Both the macro and the micro alignment marks 120, 130 may be used to dice or separate the wafer 100 into individual dies or components. The one or more first alignment processes may involve one or more kerf checks in a first direction, for example the X-axis direction, for a pair of macro alignment marks 120 at opposite sides of the wafer 100. For example, a dicing machine (not shown) may perform multiple first alignments using multiple pairs of the macro alignment marks 120 to verify the overall size and/or position of the wafer 100 in the dicing machine. In another example, the dicing machine (not shown) may use a pair of macro alignment marks 120 to adjust a dicing tool (not shown) to a particular area of the wafer, e.g., the middle, topmost or bottom most end of the wafer 100 to begin dicing the wafer 100 in the corresponding area.

The first alignment process(es) may be followed by one or more second alignment processes, each of which may involve a kerf check for a pair of micro alignment marks 130 at opposite sides of the molding compound 110 edge in the first direction. The wafer 100 may be diced using the alignment of the dicing machine or tool to the pair of micro alignment marks 130. The dicing machine or tool may perform successive kerf checks for successive pairs of the micro alignment marks 130 in order to dice the wafer 100 along all streets in the first direction, for example, along all streets 151 in the X-axis direction as shown in FIG. 1B. Following the dicing in the first direction, the dicing machine may perform successive kerf checks for pairs of the micro alignment marks 130 along a second direction in order to dice the wafer 100 along successive streets in the second direction, for example, in the Y-axis direction along streets 152 as shown in FIG. 1B. In an embodiment, prior to the kerf checks in the Y-axis direction for the micro alignment marks 130, the dicing machine may perform one or more kerf checks for a pair macro alignment marks 130 along the second direction.

In an embodiment, the wafer 100 may include active or passive devices formed therein. In another embodiment, the wafer 100 may be free from active or passive devices. In an embodiment, the molding compound may be an epoxy, a polymer, a resin, a hardener, a filler material, a flame retardant material, combinations thereof or the like. In an embodiment, a mold (not shown) or other similar device may be used during application of the molding compound 110 to the wafer 100 in order to maintain the exposed wafer portion $W_{EXP}$ from coverage by the molding compound 110. In another embodiment, the molding compound 110 may be formed over an entirety of the wafer 100 and subsequently removed using a selective etching processes, such as, for example, damascene or dual-damascene processes, in order to obtain the exposed wafer portion $W_{EXP}$.

Figure 2A:
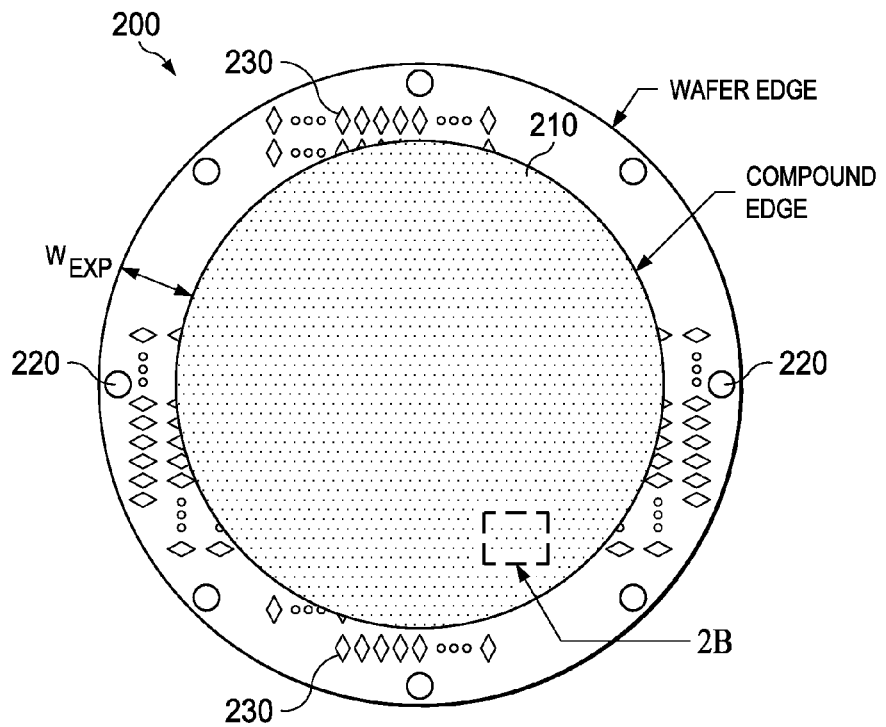
FIGS. 2A-2B illustrate a wafer having alignment marks according to an embodiment.

FIG. 2A illustrates a wafer 200 having alignment marks formed thereon according to another embodiment. As illustrated in FIG. 2A, a molding compound 210 may be formed over the wafer 200. The molding compound 210 may be formed in a manner such that an exposed wafer portion $W_{EXP}$ may be exposed from the molding compound 210. The exposed wafer portion $W_{EXP}$ may have formed thereon a plurality of macro alignment marks 220 and a plurality of micro alignment marks 230. In various embodiments, the exposed wafer portion $W_{EXP}$ may range from approximately 1.5 mm from the wafer edge to approximately 4 mm from the wafer edge. The wafer 200 and the molding compound 210 may have similar characteristics and/or compositions to those as described for the wafer 100 and the molding compound 110 of FIGS. 1A-1B.

Figure 2B:
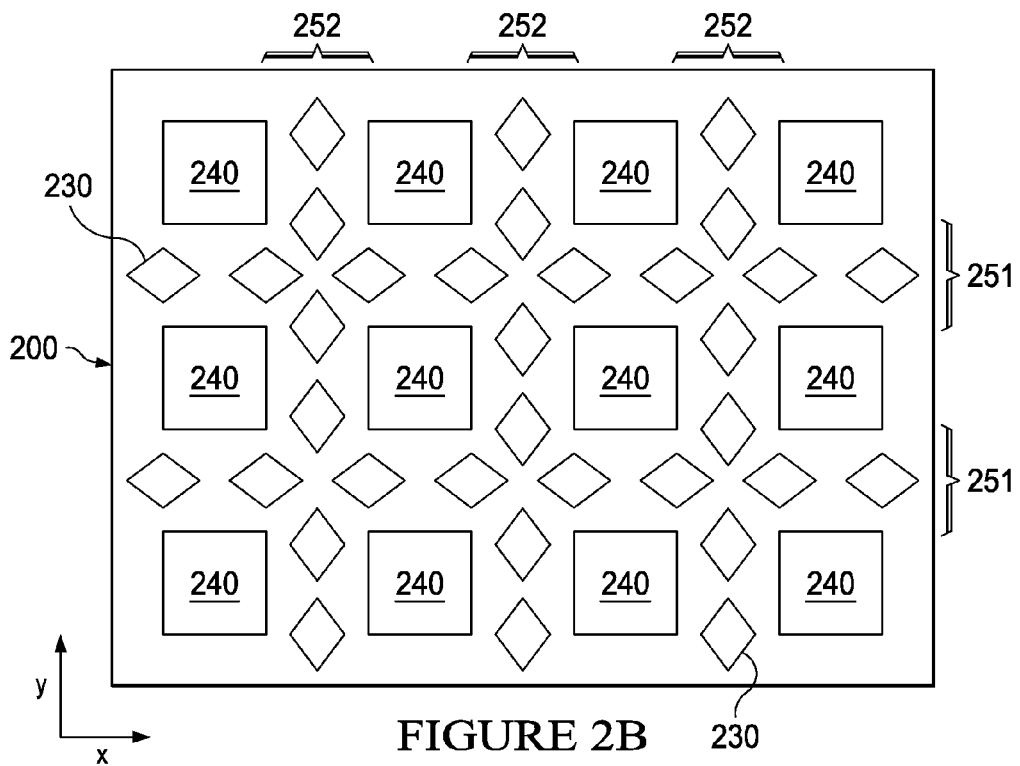

The molding compound 210 may cover dies, electrical devices or circuits (not shown in FIG. 2A) on the wafer 200. For illustrative purposes, FIG. 2B provides a view of a plurality of dies 240 as may be formed on the wafer 200 beneath the molding compound 210. The dies 240 may be separated by a first plurality of streets 251 along a first direction of the wafer 200, for example, an X-axis direction. The dies 240 may be separated by a second plurality of streets 252 along a second direction of the wafer 200, for example, a Y-axis direction.

The macro alignment marks 220 may be formed in pairs near opposite edges of the wafer 200 along the first and/or second direction. The macro alignment marks 220 may have a first shape. The macro alignment marks 220 may be used in one or more first alignment processes to align a dicing machine or tool (not shown) to the wafer 200. The micro alignment marks 230 may be formed in pairs near the edges of the molding compound 210 along the first and second direction. The micro alignment marks 230 may have a second shape, which may be different from the first shape of the macro alignment marks 220. In comparison to the micro alignment marks 130 as shown in FIG. 1A, the micro alignment marks 230 of FIGS. 2A-2B may also extend along the streets between the pairs for each street in the first and/or second direction. The micro alignment marks 230 may be used in one or more second alignment processes to align the dicing tool (not shown) to a corresponding street between arrays of dies.

Although not fully illustrated in FIG. 2A, the overall size of the macro and micro alignment marks 220, 230 may also be different from each other. In an embodiment, for example, the overall size of macro alignment marks 220 may be larger than overall size of the micro alignment marks 230. The micro alignment marks 230 may be sized to be smaller than a width of the streets between the dies, for example the first and/or second streets 251, 252 between the dies 240 as shown in FIG. 2B. The overall size of the macro and/or micro alignment marks 220, 230 is discussed in further detail below.

Forming the micro alignment marks 230 between the dies 240, as shown in FIG. 2B, may provide increased alignment precision over embodiments having micro alignment marks only at the edges of the molding compound 210. For example, alignment of a dicing tool (not shown) may be updated, continuously or periodically, during a dicing procedure by aligning the dicing tool to the micro alignment marks 230 extending along the first and/or second streets 251, 252 of the wafer 200.

In various embodiments, the micro alignment marks 230 may be formed in one or both of the first and/or second streets 251, 252 along the first and/or second direction of the wafer 200. For example, the micro alignment marks 230 may be formed at the edge of the molding compound 210 and in the first streets 251 along the X-axis direction, while micro alignment marks 230 may be formed only at the edge of the molding compound 210 for the Y-axis direction. In another example, the micro alignment marks 230 may be formed at the edge of the molding compound 210 and in second streets 252 along the Y-axis direction, while micro alignment marks 230 may be formed only at the edge of the molding compound for the X-axis direction.

Figure 3A:
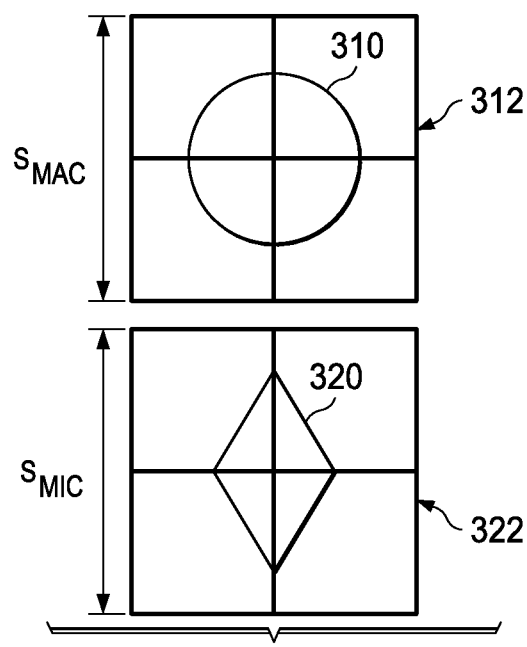
FIGS. 3A-3B illustrate various alignment marks that may be used with various alignment processes according to various embodiments.
Figure 3B:
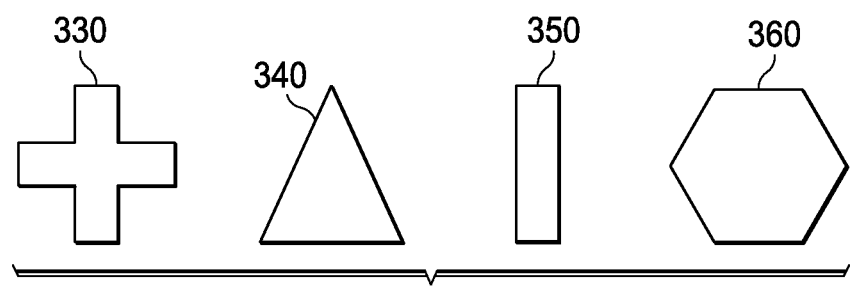

FIGS. 3A-3B illustrate various alignment marks that may be used with various alignment processes of the present embodiments. FIG. 3A illustrates a macro alignment mark 310 and a micro alignment mark 320. The macro alignment mark 310, as shown in FIG. 3A, may be shaped as a circle and the micro alignment mark 320 may be shaped as a diamond. The shape of the macro alignment mark 310 may be unique from the shape of the micro alignment mark 320. The shape of the macro and micro alignment marks 310, 320 are provided for illustrative purposes only and are not meant to limit the scope of the embodiments described herein.

Further illustrated in FIG. 3A is a macro target reticule 312 and a micro target reticule 322, each of which may be used by a dicing machine and/or dicing tool (not shown) to perform a kerf check on the respective macro and micro alignment marks 310, 320. The macro target reticule 312 may have an overall size, denoted by $S_{MAC}$, and the micro target reticule 322 may have an overall size, denoted by $S_{MIC}$. As noted previously, the overall size of the macro alignment mark(s) 310 may be larger than the overall size of the micro alignment mark(s) 320. Accordingly, the macro alignment mark 310 and corresponding macro target reticule 312 may have a larger overall size than the micro alignment mark 320 and corresponding micro target reticule 322.

In various embodiments, the macro target reticule 312 may have an overall size $S_{MAC}$ and the macro target reticule 322 may have an overall size $S_{MIC}$. By way of example, the overall size $S_{MAC}$ of the macro target reticule 312 may be less than approximately 2.54 mm, while the overall size $S_{MIC}$ of the micro target reticule 322 may be less than approximately 0.254 mm. Recall that the micro alignment marks 320 may be sized to be smaller than a corresponding width of streets between dies on a wafer, for example the first and/or second streets 251, 252 between the dies 240 as shown in FIG. 2B.

FIG. 3B illustrates various alignment mark shapes 330-370 that may be used with various alignment processes of the various embodiments discussed herein. As illustrated in FIG. 3B, the macro and/or micro alignment marks of the various embodiments discussed herein may be have an oval or ovoid shape 330, a cross shape 340, a triangle shape 350, a box shape 360 or a polygon shape 370. The triangle shape 350 may include equilateral, isosceles or scalene shaped triangles. The box shape 360 may include, but not be limited to, a rectangle having sides formed at right angles from each other, a quadrilateral having four equal sides formed at four right angles, a quadrilateral having unequal sides formed at one or more unequal angles, etc. The polygon shape 370 may include, but not be limited to, a polygon having five or more sides. In various embodiments, the macro and/or micro alignment marks 310, 320 may be symmetric or asymmetric. In an embodiment, the macro and/or micro alignment marks 310, 320 may have a strong contrast to distinguish the marks on a wafer.

Figure 4:
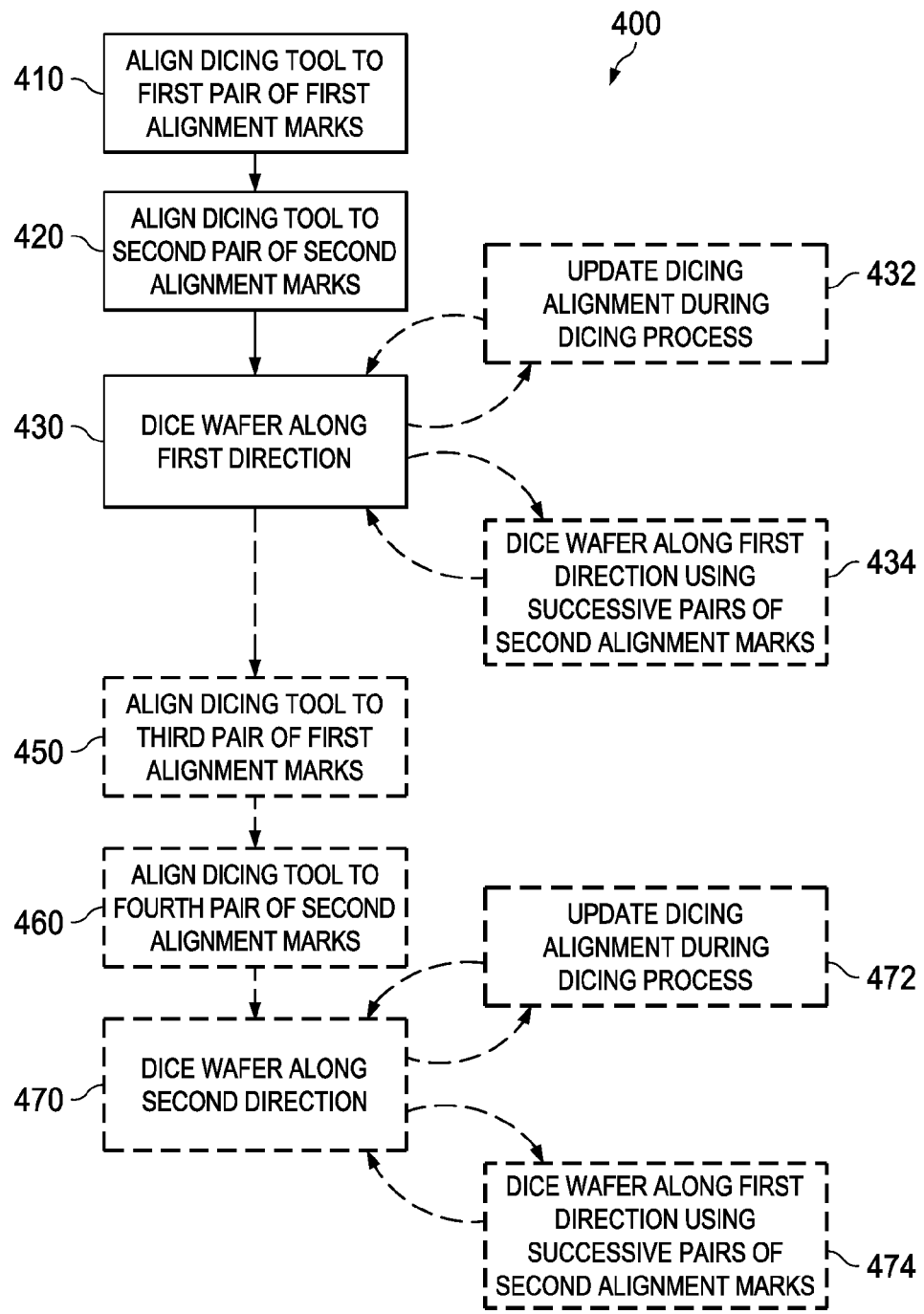
FIG. 4 illustrates a method of dicing a wafer according to an embodiment.

FIG. 4 illustrates a method 400 for dicing a wafer according to an embodiment. The method 400 may align a dicing tool to a first pair of first alignment marks along a first direction of the wafer (block 410). The first alignment marks may have a first shape. The method 400 may align the dicing tool to a second pair of second alignment marks (block 420). The second alignment marks may have a second shape and the second shape may be different from the first shape of the first alignment marks. The method 400 may dice the wafer along the first direction (block 430). In an embodiment, the first alignment marks may be larger than the second alignment marks.

In an embodiment, the method 400 may form a molding compound over the wafer prior to the aligning the dicing tool to the first pair of first alignment marks. One or more electrical connectors may be exposed from the molding compound. In an embodiment, the method 400 may update the dicing alignment during the dicing process using a plurality of second alignment marks on the wafer that may extend along the first direction between the second pair of second alignment marks (block 432). As illustrated in block 434, the method 400 may successively dice the wafer along the first direction using successive pairs of second alignment marks. The method 400 may perform the successive dicing by repeating the aligning and dicing using successive pairs of second alignment marks along the first direction until the wafer has been diced along each of the pairs of second alignment marks used for dicing along the first direction.

In another embodiment, the method 400 may align the dicing tool to a third pair of first alignment marks along a second direction of the wafer (block 450). In such an embodiment, the method 400 may align the dicing tool to a fourth pair of second alignment marks along the second direction (block 460) and may dice the wafer along the second direction using the alignment of the fourth pair of second alignment marks (block 470). In an embodiment, the method 400 may update the alignment for the dicing along the second direction using a plurality of second alignment marks on the wafer that may extend between the fourth pair of second alignment marks (block 472). As further illustrated in block 474, the method 400 may successively dice the wafer along the second direction using successive pairs of second alignment marks. The method 400 may perform the successive dicing by repeating the aligning and dicing using successive pairs of second alignment marks along the second direction until the wafer has been diced along each of the pairs of second alignment marks used for dicing the wafer along the second direction.

Figure 5:
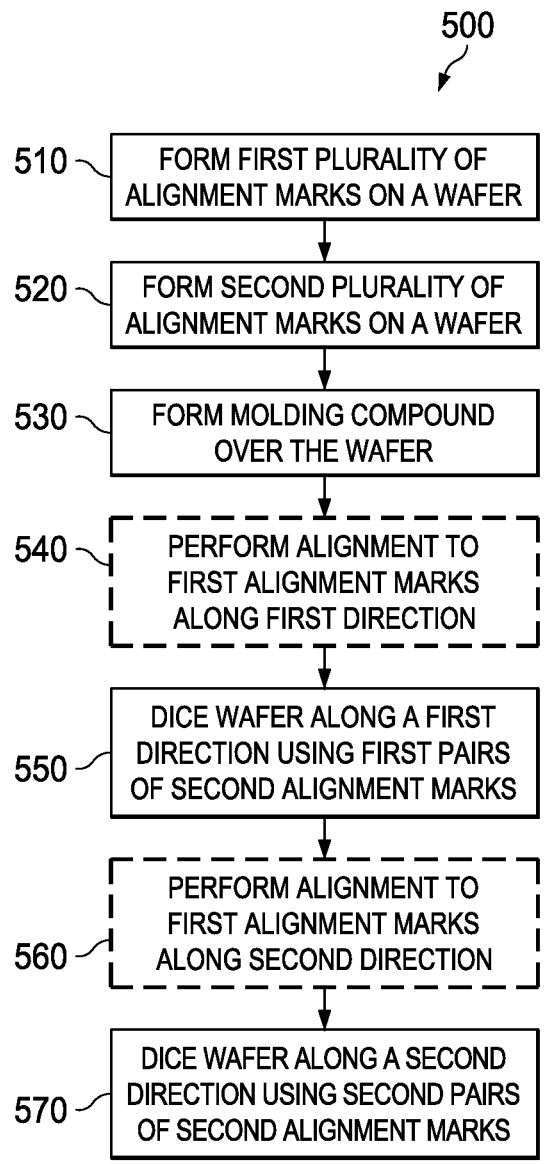
FIG. 5 illustrates another method of dicing a wafer according to another embodiment.

FIG. 5 illustrates another method 500 for dicing a wafer according to another embodiment. The method 500 may form a first plurality of alignment marks on the wafer (block 510). The first plurality of alignment marks may be formed in pairs at opposite edges of the wafer. The first plurality of alignment marks may have a first shape. The method 500 may form a second plurality of alignment marks on the wafer (block 520). The second plurality of alignment marks may be aligned to streets between dies on the wafer along the first and second direction. The second plurality of alignment marks may have a second shape. The first shape of the first plurality alignment marks may be different from the second shape of the second plurality of alignment marks.

The method 500 may form a molding compound over the wafer (block 530). After forming the molding compound over the wafer, the first plurality of alignment marks may be exposed from the molding compound. Further, at least a pair of the second alignment marks may be exposed from the molding compound at opposite ends of each of the streets on the wafer. One or more electrical connectors may also be exposed from the molding compound. The method 500 may dice the wafer along a first direction of the streets using first successive pairs of the second plurality of alignment marks (block 550). In an embodiment, prior to the dicing the wafer along the first direction, the method 500 may perform a first alignment of the wafer using a first pair of the first plurality of alignment marks along the first direction (block 540).

Following the dicing in the first direction, the method 500 may dice the wafer along a second direction using second successive pairs of the second plurality of alignment marks (block 570). In an embodiment, prior to the dicing the wafer along the second direction, the method 500 may perform a second alignment of the wafer using a second pair of the first plurality of alignment marks (block 560).

In various embodiments, the second plurality of alignment marks may extend along the streets between the dies on the wafer along the first and/or second direction. In various embodiments, a distance between an edge of the wafer and an edge of the molding compound may be greater than or equal to 1.5 mm and less than or equal to 4 mm.

Figure 6A:
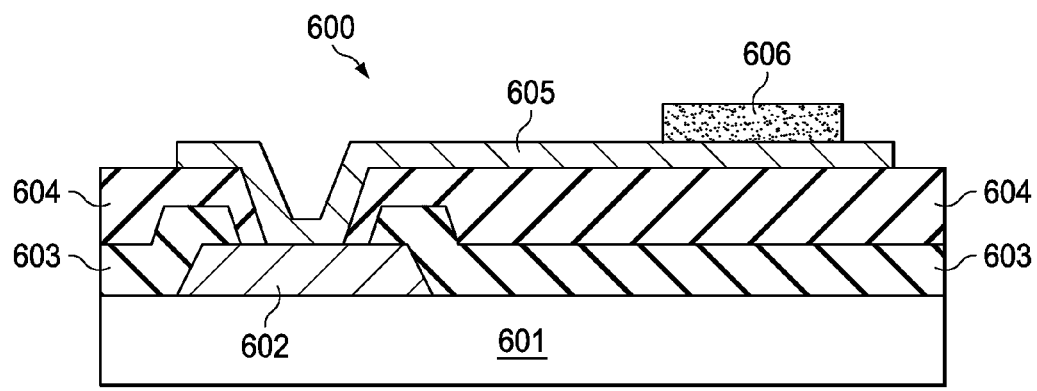
FIGS. 6A-6F illustrate cross-sectional views of intermediate stages in the manufacturing of a die in accordance with an embodiment.
Figure 6B:
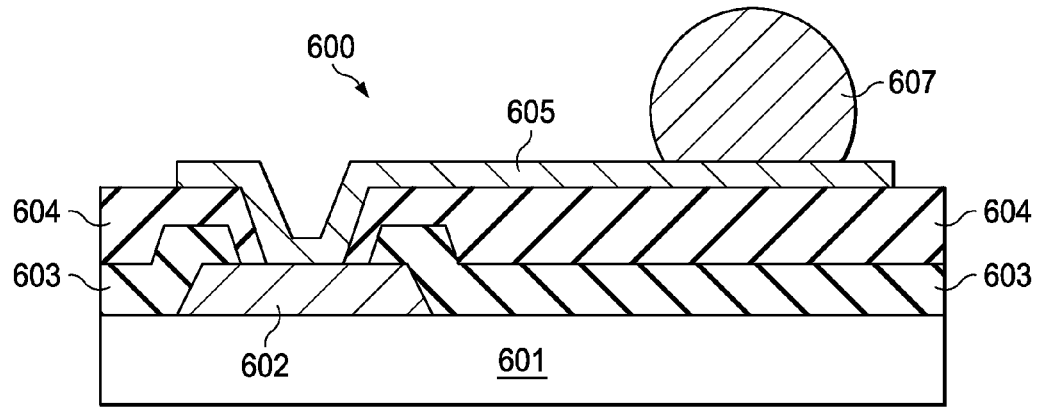
Figure 6C:
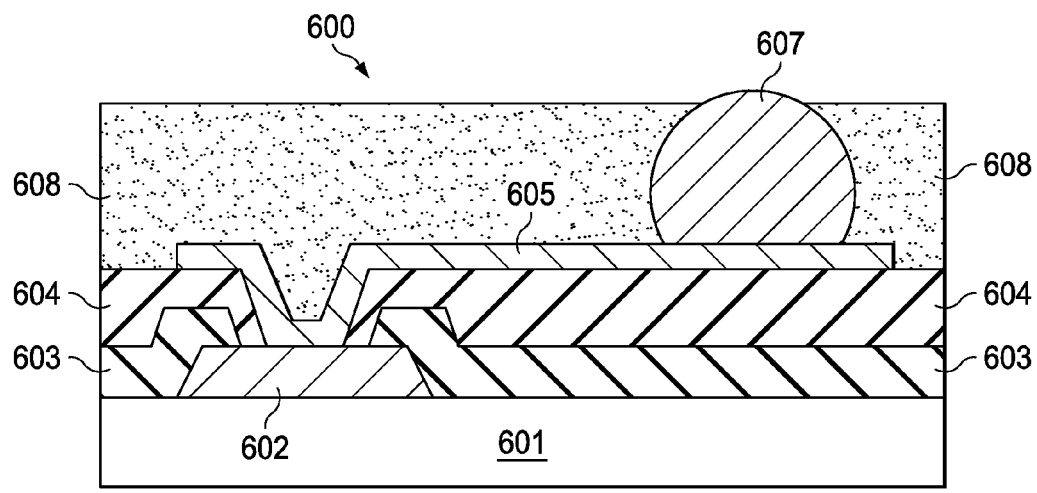
Figure 6D:
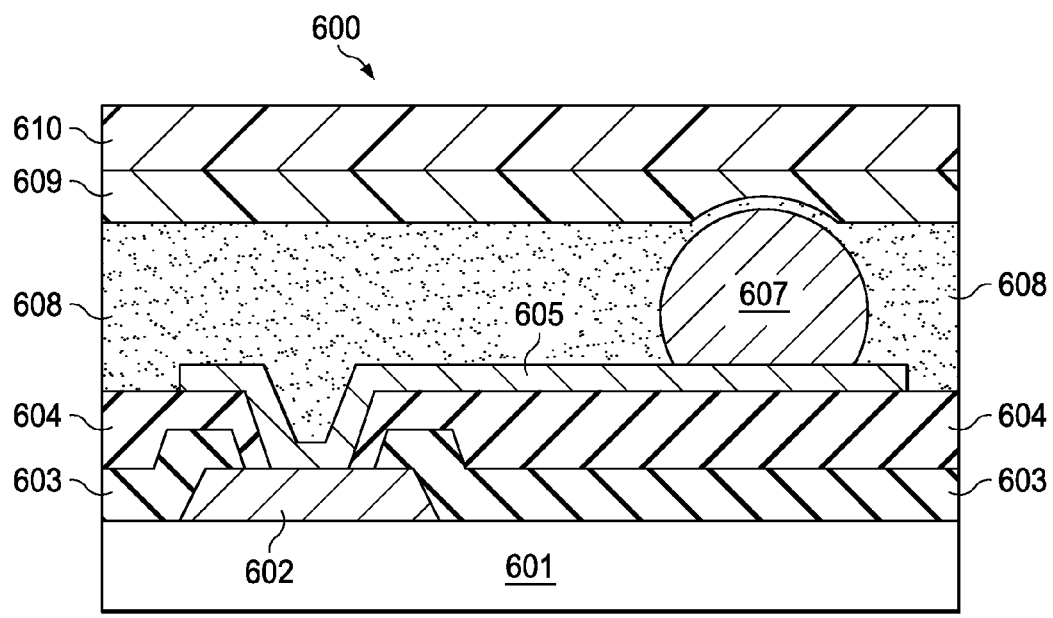
Figure 6E:
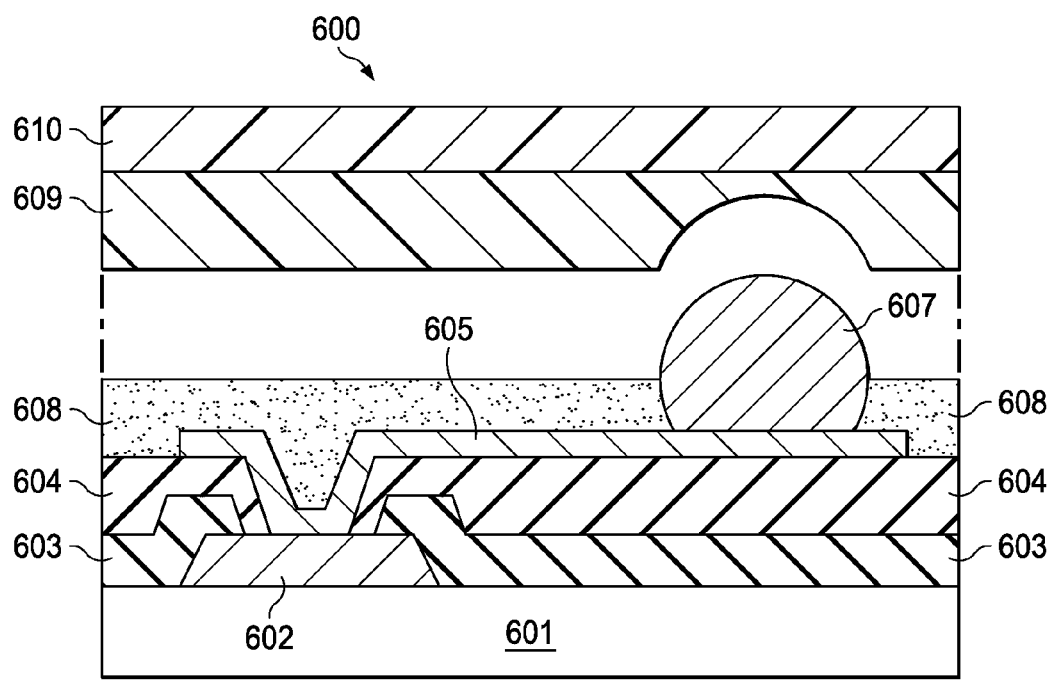
Figure 6F:
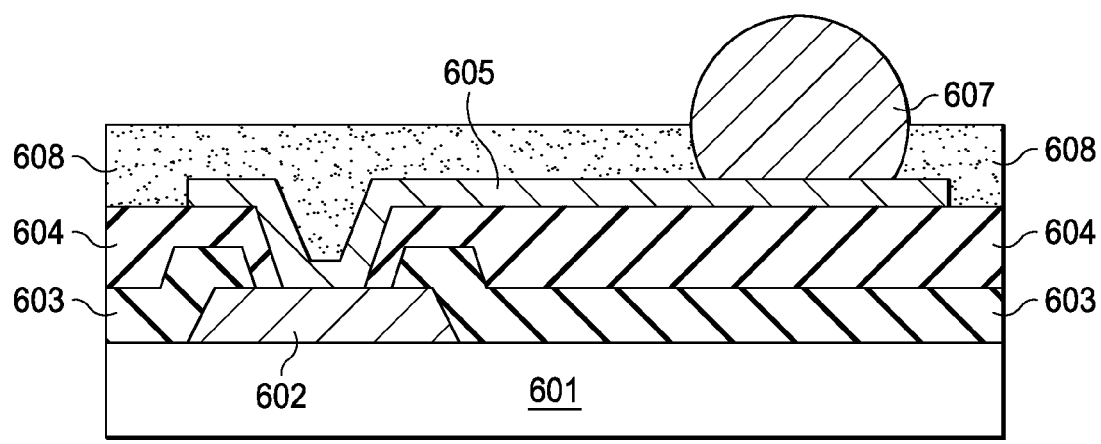
Figure 7:
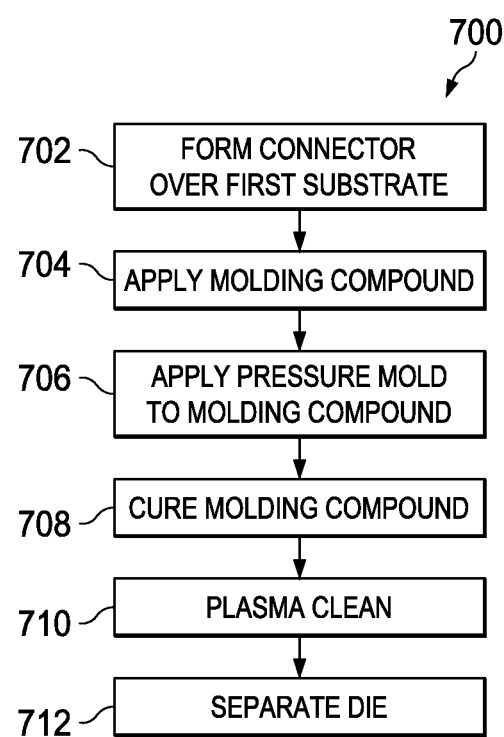
FIG. 7 illustrates a process flow of the process illustrated in FIGS. 6A-6F.

FIGS. 6A through 6F are cross-sectional views of intermediate stages in the manufacturing of a separated die in accordance with an embodiment, and FIG. 7 is a process flow 700 of the process shown in FIGS. 6A through 6F. It should be noted that FIGS. 6A-6F and 7 are provided as an illustrative example of manufacturing a separated die and a corresponding process in accordance with an embodiment and are not meant to limit the scope of embodiments discussed herein.

FIG. 6A illustrates a die 600 in an intermediate stage of manufacture. The die 600 may include a substrate 601, a contact pad 602, a first passivation layer 603, a second passivation layer 604, a post-passivation interconnect (PPI) 605, and an optional flux 606. Substrate 601 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 601 may comprise a silicon-on-insulator (SOI) substrate.

The substrate 601 may include active and passive devices (not shown in FIG. 6A). As one of ordinary skill in the art will recognize, a wide variety of devices such as transistors, capacitors, resistors, combinations of these, and the like may be used to generate the structural and functional requirements of the design for the die 600. The devices may be formed using any suitable methods. Only a portion of the substrate 601 is illustrated in the figures, as this is sufficient to fully describe the illustrative embodiments. The contact pad 602 may provide electrical connection to devices (not shown) formed within the substrate 601. It should be noted that the die may be formed on a wafer (not shown), which may have formed thereon macro and micro alignment marks in accordance with the various embodiments described herein.

FIG. 6B illustrates the formation of an electrical connector 607 (step 702) on the PPI 605. The electrical connector 607 may be a solder ball, a micro bump, a metal pillar, a controlled collapse chip connection (C4) bump, an electroless nickel-electroless palladium-immersion gold technique (ENEPIG) formed bump, or the like. The connector 607 may comprise a conductive material such as copper, aluminum, gold, nickel, silver, palladium, tin, the like, or a combination thereof. In an embodiment in which the connector 607 is a tin solder bump, the connector 607 may be formed by initially forming a layer of tin through such commonly used methods such as evaporation, electroplating, printing, solder transfer, ball placement, or the like.

FIG. 6C illustrates the formation of a molding compound 608 (step 704) over the PPI 605 and the second passivation layer 604 and may be formed adjoining the connector 607. The molding compound 608 may provide lateral support to the connector 607 during reflow. In an embodiment, the molding compound 608 may be a nonconductive material, such as an epoxy, a resin, polyimide, polybenzoxazole (PBO), benzocyclobutene (BCB), a silicone, an acrylate, the like, or a combination thereof. The molding compound 608 may be formed to have a top surface over, substantially level with, or below an apex of the connector 607.

FIG. 6D illustrates applying a mold 610 to the molding compound 608 (step 706). The mold 610 may shape or mold the molding compound 608. In an embodiment, a release compound 609 may be applied to the mold 610 to prevent the molding compound 608 from adhering to the mold 610. The release compound 609 may comprise ethylene tetrafluoroethylene (ETFE), polytetrafluoroethylene (PTFE), the like, or a combination thereof. In an embodiment, the mold 610 may be configured to accept one or more connectors 607 by way of recesses formed in the mold 610. The molding compound 608 may also be shaped by the mold 610 using a layer of release compound 609 thick enough to compress the molding compound 608 while still separating the mold 610 from the connector 607. In an embodiment, the mold 610 may be used to pressure mold the molding compound 608 to force the molding compound into openings and recesses, and may avoid air pockets or the like in the molding compound 608.

After the application of the mold 610 and the release compound 609, the molding compound 608 may be cured (step 708) and the mold 610 and the release compound 609 may be removed as illustrated in FIG. 6E. In some embodiments, the molding compound 608 may be applied while substantially liquid, and then may be cured through a chemical reaction, such as in an epoxy or resin. In some other embodiments the molding compound 608 may be an ultraviolet (UV) cured polymer applied as a gel or malleable solid capable of being disposed on the PPI 605 and second passivation layer 604 and around or conforming to the connector 607 surface. The molding compound 608 may not extend over sides of the second passivation layer 604, the first passivation layer 603 and the substrate 601. For example, the molding compound 608 may contact only a top surface of the second passivation layer 604 and may not extend over sides of the second passivation layer 604. In effect, sides of the molding compound 608 may be co-planar with sides of the substrate 601, the first passivation layer 603 and the second passivation layer 604. The molding compound 608 may remain above the substrate 601 and the contact pad 602.

After the mold 610 and the release compound 609 are removed, a plasma cleaning process may be performed (step 710) on the connector 607 as shown in FIG. 6F. The plasma cleaning process may be used to clean the connector 607 and to remove any residual release compound 609 or molding compound 608. The electrical connector 607 may be exposed from the molding compound 608. After the plasma cleaning process, the die 600 may be separated or singulated (step 712) from a wafer using a dicing process plurality of macro and micro alignment marks formed on the wafer (not shown).

In an embodiment, a die is provided. The die may include a substrate, a contact pad formed on the substrate, the contact pad connected to a device within the substrate; an electrical connector in contact with the contact pad; and a molding compound overlying the substrate and the contact pad, wherein the electrical connector is exposed from the molding compound and wherein sides of the molding compound are co-planar with sides of the substrate.

In another embodiment, a method of dicing a wafer is provided. The method may comprise forming a molding compound over the wafer, wherein one or more electrical connectors are exposed from the molding compound; aligning a dicing tool to a first pair of first alignment marks along a first direction of the wafer, the first alignment marks having a first shape; aligning the dicing tool to a second pair of second alignment marks along the first direction of the wafer, the second alignment marks having a second shape; and dicing the wafer with the dicing tool along the first direction using the alignment of the second pair of second alignment marks.

In another embodiment, another method of dicing a wafer is provided. The method may comprise forming a first plurality of alignment marks on the wafer, the first plurality of alignment marks being formed in pairs at opposite edges of the wafer and having a first shape; forming a second plurality of alignment marks on the wafer, the second plurality of alignment marks being aligned to streets between dies on the wafer and having a second shape; forming a molding compound over the wafer, wherein one or more electrical connectors are exposed from the molding compound and wherein the first plurality of alignment marks and at least a pair of the second plurality of alignment marks are exposed from the molding compound; dicing the wafer along a first direction of the streets using first successive pairs of the second alignment marks; and dicing the wafer along a second direction of the streets using second successive pairs of the second alignment marks.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of dicing a wafer, comprising:
forming a molding compound over the wafer, wherein one or more electrical connectors are exposed through the molding compound;
aligning a dicing tool to a first pair of first alignment marks along a first direction of the wafer, the first alignment marks having a first shape;
aligning the dicing tool to a second pair of second alignment marks along the first direction of the wafer, the second alignment marks having a second shape; and
dicing the wafer with the dicing tool along the first direction using the alignment of the second pair of second alignment marks.

2. The method of claim 1, wherein the first shape is different from the second shape.

3. The method of claim 1, further comprising:
updating the alignment for the dicing the wafer using a plurality of second alignment marks on the wafer along the first direction between the second pair of second alignment marks.

4. The method of claim 1, further comprising:
after the dicing the wafer with the dicing tool along the first direction, aligning the dicing tool to a subsequent pair of second alignment marks along the first direction of the wafer;
dicing the wafer with the dicing tool along the first direction using the alignment of the subsequent pair of second alignment marks; and
repeating the aligning and dicing of subsequent pairs of second alignment marks along the first direction until the wafer has been diced along pairs of second alignment marks used for dicing along the first direction.

5. The method of claim 1, wherein the first pair of first alignment marks are located near opposite edges of the wafer along the first direction.

6. The method of claim 1, wherein the second pair of second alignment marks are located near opposite edges of the molding compound on the wafer along the first direction.

7. The method of claim 1, wherein the first alignment marks are larger than the second alignment marks.

8. The method of claim 1, wherein the forming the molding compound over the wafer further comprises:
applying the molding compound over the wafer; and
applying a pressure mold to the molding compound.

9. The method of claim 1, further comprising:
aligning the dicing tool to a third pair of first alignment marks along a second direction of the wafer;
aligning the dicing tool to a fourth pair of second alignment marks along the second direction of the wafer; and
dicing the wafer with the dicing tool along the second direction using the alignment of the fourth pair of second alignment marks.

10. The method of claim 9, further comprising:
updating the alignment for the dicing the wafer along the second direction using a plurality of second alignment marks on the wafer between the fourth pair of second alignment marks.

11. The method of claim 9, further comprising:
after the dicing the wafer with the dicing tool along the second direction, aligning the dicing tool to a subsequent pair of second alignment marks along the second direction of the wafer;
dicing the wafer with the dicing tool along the second direction using the alignment of the subsequent pair of second alignment marks; and
repeating the aligning and dicing of subsequent pairs of second alignment marks along the second direction until the wafer has been diced along pairs of second alignment marks used for dicing along the second direction.

12. A method of dicing a wafer, comprising:
forming a first plurality of alignment marks on the wafer, the first plurality of alignment marks being formed in pairs at opposite edges of the wafer and having a first shape;

forming a second plurality of alignment marks on the wafer, the second plurality of alignment marks being aligned to streets between dies on the wafer and having a second shape;

forming a molding compound over the wafer, wherein one or more electrical connectors are exposed through the molding compound and wherein the first plurality of alignment marks and at least a pair of the second plurality of alignment marks are exposed from the molding compound;

dicing the wafer along a first direction of the streets using first successive pairs of the second alignment marks; and dicing the wafer along a second direction of the streets using second successive pairs of the second alignment marks.

13. The method of claim 12, wherein the first shape is different from the second shape.

14. The method of claim 12, wherein the second plurality alignment marks extend along the streets between the dies on the wafer.

15. The method of claim 12, further comprising:
prior to dicing the wafer along the first direction, performing a first alignment of the wafer using a first pair of the first plurality of alignment marks along the first direction.

16. The method of claim 12, further comprising:
prior to dicing the wafer along the second direction, performing a second alignment of the wafer using a second pair of the first plurality of alignment marks along the second direction.

17. The method of claim 12, wherein a distance between an edge of the wafer and an edge of the molding compound is greater than or equal to 1.5 mm and less than or equal to 4 mm.

18. The method of claim 12, wherein the first plurality of alignment marks, the second plurality of alignment marks, the molding compound, and the one or more electrical connectors are each formed on a same side of the wafer.

19. A method comprising:
forming a first plurality of alignment marks on a wafer, the first plurality of alignment marks being formed in pairs at opposite edges of the wafer and having a first shape;

forming a second plurality of alignment marks on the wafer, the second plurality of alignment marks aligned with and extending along streets between dies on the wafer and having a second shape, the second shape being different than the first shape;

forming a molding compound over the wafer, wherein one or more electrical connectors are exposed through the molding compound and wherein the first plurality of alignment marks and at least a first pair of the second plurality of alignment marks are exposed from the molding compound; and dicing the wafer along the streets using successive pairs of the second alignment marks.

20. The method of claim 19 further comprising:
updating an alignment for the dicing the wafer using a second pair of the second plurality of alignment marks between the at least the first pair of the second plurality of alignment marks.

21. The method of claim 19, wherein the dicing the wafer further comprises:
dicing the wafer along a first direction of the streets using first successive pairs of the second alignment marks; and
dicing the wafer along a second direction of the streets using second successive pairs of the second alignment marks, the first direction being substantially perpendicular to the second direction.

22. The method of claim 21, further comprising:
before the dicing the wafer along the first direction, performing a first alignment of the wafer using a first pair of the first plurality of alignment marks along the first direction; and
before the dicing the wafer along the second direction, performing a second alignment of the wafer using a second pair of the first plurality of alignment marks along the second direction.

* * * * *